US012727153B2

(12) United States Patent
Han

(10) Patent No.: US 12,727,153 B2
(45) Date of Patent: Sep. 1, 2026

(54) SEMICONDUCTOR STRUCTURE AND METHOD FOR MANUFACTURING SAME

(71) Applicant: CHANGXIN MEMORY TECHNOLOGIES, INC., Hefei City (CN)

(72) Inventor: Qinghua Han, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 466 days.

(21) Appl. No.: 18/452,396

(22) Filed: Aug. 18, 2023

(65) Prior Publication Data

US 2024/0107752 A1 Mar. 28, 2024

Related U.S. Application Data

(63) Continuation of application No. PCT/CN2023/072822, filed on Jan. 18, 2023.

(30) Foreign Application Priority Data

Sep. 27, 2022 (CN) ........................ 202211183887.3

(51) Int. Cl.
*H10B 12/00* (2023.01)

(52) U.S. Cl.
CPC ........... *H10B 12/488* (2023.02); *H10B 12/02* (2023.02); *H10B 12/482* (2023.02)

(58) Field of Classification Search
CPC .................................................... H10B 12/488
See application file for complete search history.

(56) References Cited

U.S. PATENT DOCUMENTS

| | | | |
|---|---|---|---|
| 9,117,528 | B2 | 8/2015 | Masuoka |
| 10,366,983 | B2 | 7/2019 | Beigel |
| 10,847,511 | B2 | 11/2020 | Beigel |
| 11,264,377 | B2 | 3/2022 | Beigel |
| 11,626,498 | B2 | 4/2023 | Zhu |
| 2015/0206588 | A1 | 7/2015 | Masuoka |

(Continued)

FOREIGN PATENT DOCUMENTS

| | | |
|---|---|---|
| CN | 101933135 A | 12/2010 |
| CN | 104347379 A | 2/2015 |

(Continued)

OTHER PUBLICATIONS

International Search Report in the international application No. PCT/CN2023/072822, mailed on Jun. 2, 2023. 3 Pages.

(Continued)

*Primary Examiner* — Tucker J Wright
(74) *Attorney, Agent, or Firm* — Syncoda LLC; Feng Ma

(57) ABSTRACT

The application provides a semiconductor structure and a method for manufacturing the same. The semiconductor structure includes a substrate and multiple Word Lines (WLs), the multiple WLs extend along a first direction and are arranged on the substrate at intervals along a second direction, a WL isolation structure is arranged between every two adjacent WLs and includes at least a first isolation layer and a second isolation layer stacked along the second direction and made of different materials, and the first direction and the second direction intersect with each other.

14 Claims, 10 Drawing Sheets

(56) References Cited

U.S. PATENT DOCUMENTS

| | | | | |
|---|---|---|---|---|
| 2019/0074363 | A1 | 3/2019 | Zhu | |
| 2019/0206861 | A1 | 7/2019 | Beigel | |
| 2019/0348413 | A1 | 11/2019 | Beigel | |
| 2021/0050346 | A1 | 2/2021 | Beigel | |
| 2022/0189952 | A1 | 6/2022 | Beigel | |
| 2023/0110504 | A1 | 4/2023 | Huilong | |
| 2023/0413518 | A1* | 12/2023 | Kim | H10B 12/05 |

FOREIGN PATENT DOCUMENTS

| | | | |
|---|---|---|---|
| CN | 109461738 | A | 3/2019 |
| CN | 110383477 | A | 10/2019 |
| CN | 111656523 | A | 9/2020 |
| CN | 111785719 | A | 10/2020 |
| CN | 114141712 | A | 3/2022 |
| CN | 114141713 | A | 3/2022 |
| CN | 114284270 | A | 4/2022 |
| CN | 114420644 | A | 4/2022 |
| EP | 2246883 | A1 | 11/2010 |
| WO | 2019005218 | A1 | 1/2019 |

OTHER PUBLICATIONS

First Office Action of TW application No. 112117801, issued on Dec. 7, 2023.

* cited by examiner 804 804
802
801
100b
400
100
Z
Y 804
804
802
700
801
100b
400
100
Z
Y

SEMICONDUCTOR STRUCTURE AND METHOD FOR MANUFACTURING SAME

CROSS-REFERENCE TO RELATED APPLICATIONS

This application is a continuation application of International Patent Application No. PCT/CN2023/072822, filed on Jan. 18, 2023, which claims priority to Chinese Patent Application No. 202211183887.3 filed on Sep. 27, 2022. The contents of these applications are hereby incorporated by reference in their entirety.

BACKGROUND

Dynamic Random Access Memory (DRAM) is a semiconductor memory which can randomly write and read data at a high speed, and is widely applied in data storage devices or apparatuses.

The DRAM includes multiple storage units arranged on a substrate, each of the storage units includes a capacitor and a transistor. The transistor is provided with a gate connected to a Word Line (WL), a drain connected to a Bit Line (BL), and a source connected to the capacitor. A voltage signal on the WL may control the transistor to be in on or off state, and then data information stored in the capacitor can be read through the BL, or data information can be written into the capacitor through the BL for storage. A WL isolation structure may be arranged between adjacent WLs.

However, with the improvement of integration of the DRAM, the isolation effect of the WL isolation structure becomes poor, which affects storage performance of the DRAM.

SUMMARY

The disclosure relates to the technical field of semiconductors, and in particular to a semiconductor structure and a method for manufacturing the same.

The disclosure provides a semiconductor structure and a method for manufacturing the same, which may effectively improve an isolation effect of the WL isolation structure, and improve performance of the semiconductor structure.

According to a first aspect, the disclosure provides a semiconductor structure, including a substrate and multiple WLs.

The multiple WLs extend in a first direction and are arranged on the substrate at intervals in a second direction. For every two adjacent WLs, a WL isolation structure is arranged therebetween. The WL isolation structure includes at least a first isolation layer and a second isolation layer stacked in the second direction and made of different materials, and the first direction and the second direction intersect with each other.

According to a second aspect, the disclosure provides a method for manufacturing a semiconductor structure, including the following operations of:

providing a substrate; and forming a plurality of WLs and WL isolation structures, with the plurality of WLs extending in a first direction and being arranged on the substrate at intervals in a second direction. For every two adjacent WLs, a respective one of the WL isolation structures is arranged therebetween, each of the WL isolation structures at least partially including a first isolation layer and a second isolation layer stacked in the second direction and made of different materials.

The first direction and the second direction intersect with each other.

BRIEF DESCRIPTION OF THE DRAWINGS

In order to explain embodiments of the disclosure or technical solutions in the related art more clearly, the drawings required to be used in descriptions of the embodiments or the related art will be briefly introduced below. It is apparent that the drawings in the following descriptions are some embodiments of the disclosure, and those of ordinary skill in the art may also assume other drawings according to these drawings without paying any creative work.

LIST OF REFERENCE SYMBOLS

Figure 1:
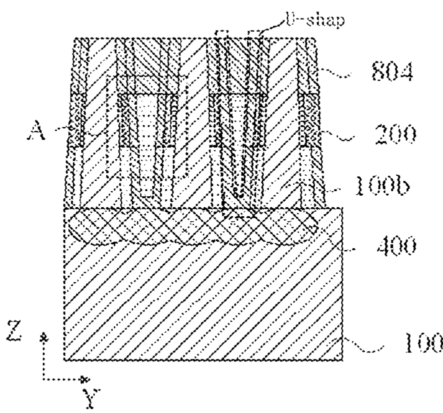
FIG. 1 is a schematic view of a semiconductor structure, viewed in a second direction, according to an embodiment of the disclosure.

100: substrate; 100*a*: semiconductor layer; 100*b*: semiconductor column; 101: WL groove; 102: BL groove; 200: WL; 300: WL isolation structure; 301: first isolation layer; 302: second isolation layer; 303: third isolation layer; 400: BL; 500: BL isolation structure; 600: active part; 601: source region; 602: channel region; 603: drain region; 700: gate dielectric layer; 800: first dielectric layer; 801: second dielectric layer; 801*a*: first groove; 802: third dielectric layer; 802*a*: second groove; 803: fourth dielectric layer; 804: support layer; 804*a*: third groove; 805: mask layer.

DETAILED DESCRIPTION

In a DRAM, a transistor of each storage unit is provided with a gate connected to a Word Line (WL), a drain connected to a Bit Line (BL), and a source connected to a capacitor. A voltage signal on the WL may control the transistor to be in on or off state, and then data information stored in the capacitor can be read through the BL, or data information can be written into the capacitor through the BL for storage. Therefore, transmission of electrical signals in the WL affects storage and reading of the DRAM. With the improvement of integration of the DRAM, a distance between adjacent WLs in the DRAM is reduced, and thus a problem of capacitance coupling or leakage of electricity between adjacent WLs occurs easily, which results in crosstalk of electrical signals, affects signal storage or reading processes of different storage units, and reduces usage performance of the DRAM.

In the related art, a corresponding WL isolation structure may be arranged between adjacent WLs, to eliminate electrical interference between adjacent WLs. For example, an insulation layer is arranged between adjacent WLs, to isolate electronic transmissions between adjacent WLs from each other by the insulation layer, thereby avoiding interference of the electrical signals. Optionally, an isolation layer with an airgap is arranged between adjacent WLs, to reduce a coupling capacitance between adjacent WLs by the airgap, thereby isolating electronic transmissions between adjacent WLs from each other and avoiding interference of the electrical signals.

In the above structure, the insulation layer requires a large space to ensure that its thickness is sufficient for generating an insulation effect, and the isolation layer with an airgap also requires a large space to ensure integrity of the airgap, so as to ensure an isolation effect of electronic transmission between adjacent WLs. However, with a decrease in the distance between adjacent WLs, a space between adjacent WLs is smaller, so that it is unable to ensure an effective thickness of the insulation layer, and it is also difficult to provide an airgap having a more complete structure. Therefore, the insulation layer and the isolation layer with an airgap in the related art cannot effectively ensure an isolation effect of adjacent WLs in the high-integrity DRAM, thereby affecting storage performance of the DRAM.

On the above basis, the disclosure provides a semiconductor structure and a method for manufacturing the same, in which multiple WLs are arranged in a substrate. For every two adjacent WLs, a WL isolation structure is arranged therebetween, and adjacent WLs are isolated from each other by the WL isolation structure, to avoid electrical interference occurred between adjacent WLs. The WL isolation structure includes at least a first isolation layer and a second isolation layer stacked in a second direction and made of different materials. Usage of the first isolation layer and the second isolation layer made of different materials may reduce a leakage current and parasitic capacitance of the WL isolation structure, thereby improving an isolation effect of adjacent WLs, effectively avoiding a problem of crosstalk occurred between electrical signals in adjacent WLs, and helping to improve integration of the semiconductor structure. In this way, working stability of the semiconductor structure may be effectively ensured and performance of the semiconductor structure is improved.

In order to make the purpose, technical solutions and advantages of the disclosure clearer, the technical solutions in the embodiments of the disclosure will be described in more detail below with reference to the drawings in the preferred embodiments of the disclosure. In the drawings, the same or similar reference numerals always represent the same or similar components or components with the same or similar functions. The described embodiments are a part of the embodiments of the disclosure, rather than all of the embodiments. The embodiments described below with reference to the drawings are exemplary and intended to explain the disclosure, while cannot be understood as limiting the disclosure. Based on the embodiments in the disclosure, all other embodiments obtained by those of ordinary skill in the art without pay any creative work fall within the scope of protection of the disclosure. The embodiments of the disclosure will be explained in detail below with reference to the drawings.

Figure 2:
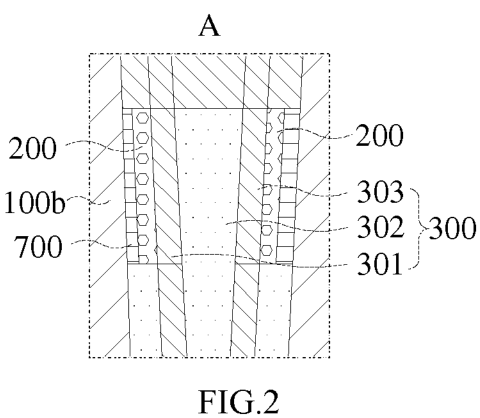
FIG. 2 is a schematic enlarged partial view of area A in FIG. 1.
Figure 3:
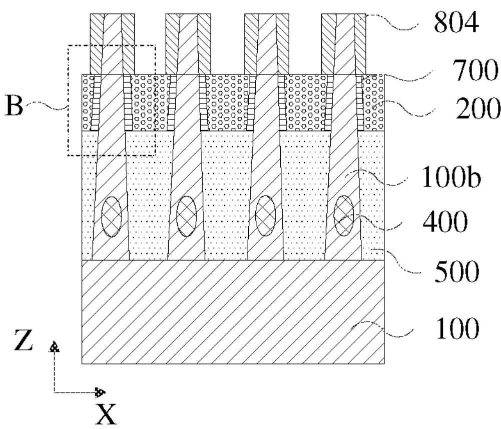
FIG. 3 is a schematic view of a semiconductor structure, viewed in a first direction, according to an embodiment of the disclosure.
Figure 4:
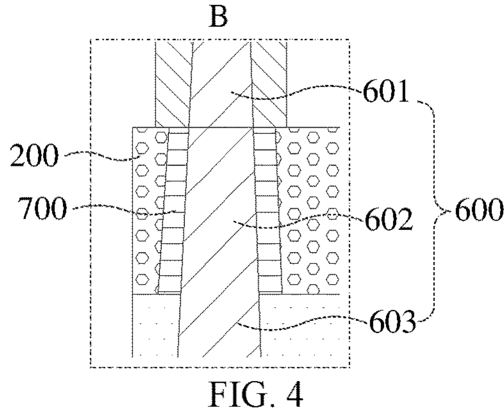
FIG. 4 is a schematic enlarged partial view of area B in FIG. 3.

FIG. 1 is a schematic view of a semiconductor structure, viewed in a second direction, according to an embodiment of the disclosure, FIG. 2 is a schematic enlarged partial view of area A in FIG. 1, FIG. 3 is a schematic view of a semiconductor structure, viewed in a first direction, according to an embodiment of the disclosure, and FIG. 4 is a schematic enlarged partial view of area B in FIG. 3. With reference to FIG. 1 to FIG. 4, the disclosure provides a semiconductor structure.

Specifically, the semiconductor structure provided in the embodiment of the disclosure includes a substrate 100 and multiple WLs 200.

Multiple WLs 200 extend along a first direction and are arranged on the substrate 100 at intervals in a second direction. A WL isolation structure 300 is arranged between every two adjacent WLs 200 and includes at least a first isolation layer 301 and a second isolation layer 302 stacked in the second direction and made of different materials. The first direction and the second direction intersect with each other.

It should be noted that the semiconductor structure of the disclosure may include, but is not limited to a DRAM, a Static Random Access Memory (SRAM), a flash memory, an Electrically Erasable Programmable Read-Only Memory (EEPROM), a Phase Change Random Access Memory (PRAM) or a Magnetoresistive Random Access Memory (MRAM). Non-memory devices may be a logic device (such as a microprocessor, a Digital Signal Processor (DSP), or a microcontroller) or devices similar thereto. The embodiment is explained by an example where the semiconductor structure is the DRAM.

The DRAM includes multiple storage units arranged in an array on the substrate 100, and the substrate 100 may support the storage units. Material of the substrate 100 may be monocrystalline silicon, polycrystalline silicon, amorphous silicon, silicon germanium compounds, silicon-on-insulator (SOI), or other materials known to those skilled in the art. The embodiment of the disclosure is explained by taking the monocrystalline silicon as an example.

The storage unit of the DRAM includes multiple BLs 400 and multiple WLs 200, multiple WLs 200 extend along the first direction and are arranged at intervals in the second direction, and multiple BLs 400 extend along the second direction and are arranged at intervals in the first direction. The first direction is a direction indicated by X in FIG. 3, the second direction is a direction indicated by Y in FIG. 1, and the first direction and the second direction intersect with each other. In the embodiment of the disclosure, the first direction and the second direction may be perpendicular to each other.

The WL isolation structure 300 is arranged between every two adjacent WLs 200, the first isolation layer 301 and the second isolation layer 302 of the WL isolation structure 300 are made of different materials and stacked in a direction (i.e., the second direction) in which adjacent WLs 200 are arranged at intervals. Based on a fact that both the first isolation layer 301 and the second isolation layer 302 have the isolation effect and are made of different materials, if electronic transmission occurs between adjacent WLs 200, interfering electrons need to pass through at least the first isolation layer 301 and the second isolation layer 302 to affect transmission of electrical signals of adjacent WLs 200. The first isolation layer 301 and the second isolation layer 302 achieve different blocking effects on the electrons due to the different materials themselves, which also increases a transmission path of the interfering electrons and alleviates an interference effect of the interfering electrons on adjacent WLs 200, thereby improving an isolation effect of the WL isolation structure 300 on electronic transmission.

Furthermore, the first isolation layer 301 and the second isolation layer 302 are stacked onto one another in the second direction, and occupy a small space between adjacent WLs 200. When the distance between adjacent WLs 200 decrease as the integration of the DRAM increases, structural integrality of the WL isolation structure 300 will not be affected. Therefore, the WL isolation structure 300 provided in the embodiment of the disclosure helps to improve integration of the DRAM.

With reference to FIG. 1 and FIG. 2, the WL isolation structure 300 of the embodiment of the disclosure includes the first isolation layer 301, the second isolation layer 302 and a third isolation layer 303 sequentially stacked in the second direction. The first isolation layer 301 and the third isolation layer 303 are made of the same material. It should be noted that, the first isolation layer 301 and the third isolation layer 303 between two adjacent WLs 200 are close to the two WLs 200 respectively and may be fit to the two WLs 200 respectively. The second isolation layer 302 is located at a position between the first isolation layer 301 and the third isolation layer 303 in the second direction. Two side surfaces of the second isolation layer 302 opposite to one another in the second direction may be fit to the first isolation layer 301 and the third isolation layer 303 respectively. In this way, space occupied by the WL isolation structure 300 may be effectively reduced, which helps to improve integration of the DRAM.

If electronic transmission occurs between two adjacent WLs 200, interfering electrons need to pass through the first isolation layer 301, the second isolation layer 302 and the third isolation layer 303 sequentially, to affect transmission of electrical signals of adjacent WLs 200. Therefore, the interfering electrons travels through a longer transmission path, which may alleviate the interference effect of the interfering electrons on adjacent WLs 200, and ensure the isolation effect of the WL isolation structure 300.

Of course, in some embodiments, other structures with electrical isolation effects may be further arranged between the first and second isolation layers 301, 302 and two adjacent WLs 200 to improve the isolation effect. In this respect the disclosure of the invention is not limited to these embodiments.

The material of the first isolation layer 301 is the same as the material of the third isolation layer 303, so that the difficulty of manufacturing the WL isolation structure 300 may be effectively reduced. The material of one of the first isolation layer 301 and the second isolation layer 302 includes a nitride, and the material of the other of the first isolation layer 301 and the second isolation layer 302 includes an oxide. In the embodiment of the disclosure, the material of one of the first isolation layer 301 and the second isolation layer 302 includes silicon nitride or silicon carbonnitride, and the material of the other of the first isolation layer 301 and the second isolation layer 302 includes silicon oxide.

In this way, the WL isolation structure 300 with a Nitride-Oxide-Nitride (NON) structure or an Oxide-Nitride-Oxide (ONO) structure may be formed. In the WL isolation structure 300, the presence of the oxide may effectively reduce a leakage current in the WL 200 and improve a protection effect of the WL 200. The presence of the nitride may effectively reduce a parasitic capacitance between adjacent WLs 200. Therefore, the WL isolation structure 300 of the embodiment of the disclosure achieves the isolation effect of adjacent WLs 200 by reducing the leakage current of the WL 200 and the parasitic capacitance between adjacent WLs 200.

In some embodiments, materials of the first isolation layer 301 and the second isolation layer 302 may also be Spin on carbon (SOC), Boro-phospho-silicate glass (BPSG), Phospho-silicate glass (PSG), Un-doped silicate glass (USG), Spin coating dielectric (SOD), or the like.

The first isolation layer 301 and the third isolation layer 303 have two structures as follows.

In a first possible implementation, the first isolation layer 301 and the third isolation layer 303 are connected to each other, and form a U-shape structure in a cross section of the WL isolation structure 300 in the second direction. A joint where the first isolation layer 301 and the third isolation layer 303 are connected is located on a side of the second isolation layer 302 facing the substrate 100.

It should be noted that the cross section of the WL isolation structure 300 in the second direction is a cross section shown in FIG. 1 and FIG. 2. The first isolation layer 301 and the third isolation layer 303 are connected to each other. The first isolation layer 301 and the third isolation layer 303 may be formed synchronously in a process of manufacturing the WL isolation structure 300, and may be located at the same layer and made of the same material, which may effectively reduce difficulty of manufacturing the WL isolation structure 300.

Furthermore, a joint position of the first isolation layer 301 and the third isolation layer 303 may be located on a side of the second isolation layer 302 facing the substrate 100 (that is, a bottom of the second isolation layer 302). The first isolation layer 301 and the second isolation layer 302 are connected to one another to form a U-shape structure, and an opening of the U-shape structure is facing away from the substrate 100. As such, the materials can be deposited through the opening of the U-shape structure to form the second isolation layer 302 in the process of manufacturing the WL isolation structure 300, thereby reducing the difficulty of manufacturing the second isolation layer 302.

In a second achievable implementation, in a cross section of the WL isolation structure 300 along the second direction, the first isolation layer 301 and the third isolation layer 303 are unconnected with each other.

It should be noted that, the first isolation layer 301 and the third isolation layer 303 are unconnected with each other, so that structural diversity of the WL isolation structure 300 can be ensured, and the WL isolation structure 300 is applicable to semiconductor structures with different structures. Of course, in some embodiments, due to the fact that the first isolation layer 301 and the third isolation layer 303 are unconnected with each other, the first isolation layer 301 and the third isolation layer 303 may also be made by different materials, to achieve a purpose of adjusting the isolation effect of the WL isolation structure 300 by adjusting the materials, thereby improving structural flexibility of the WL isolation structure 300.

With reference to FIG. 3 and FIG. 4, in the semiconductor structure of the disclosure, multiple BLs 400 are arranged on the substrate 100 and located on a side of the WL 200 facing the substrate 100, and a BL isolation structure 500 is arranged between every two adjacent BLs 400.

It should be noted that, multiple BLs 400 are located on a side of the WL 200 facing the substrate 100, so that mutual interference between the BL 400 and the WL 200 may be avoided, thereby ensuring the structural stability of the DRAM. The BL isolation structure 500 between every two adjacent BLs 400 may be a filling layer formed by the isolation materials filled between two adjacent BLs 400. In the embodiment of the disclosure, the isolation materials of the BL isolation structure 500 may include, but are not limited to silicon oxide, silicon nitride, silicon carbide, or silicon carbonnitride. Similar to the WL isolation structure 300, the BL isolation structure 500 may also block electronic transmission between two adjacent BLs 400, thereby ensuring the transmission stability of electrical signals in each BL 400 and improving the storage performance of the DRAM.

With reference to FIG. 2 and FIG. 4, the semiconductor structure of the disclosure further includes transistor structures arranged on the substrate 100, and each of the transistor structures includes an active part 600. The WL 200 is arranged around at least a part of an outer periphery of the active part 600. The WL 200 corresponds to a channel region 602 of the active part 600. A gate dielectric layer 700 is arranged between the WL 200 and the channel region 602.

It should be noted that, although the WL 200 shown in the above embodiment is arranged around at least a part of an outer periphery of the active part 600 of the transistor structure, the WL 200 may surround the entire outer periphery of the active part 600 in some embodiments, thereby forming a Gate all-around field effect transistor (GAA). The WL 200 corresponds to the channel region 602 of the active part 600, the gate dielectric layer 700 is arranged between the WL 200 and the channel region 602, and the gate dielectric layer 700 may avoid direct conduction between the WL 200 and the channel region 602, which may result in the failure of the transistor structure.

The gate dielectric layer 700 may be made of materials with high dielectric constants, such as silicon dioxide, silicon carbide, aluminum trioxide, aluminum pentoxide, yttrium oxide, hafnium silicate oxide, hafnium dioxide, zirconium dioxide, strontium carbonate, zirconium silicate oxide, or the like, and the disclosure does not make limitations to the materials of the gate dielectric layer 700.

The active part 600 extends in a direction perpendicular to the substrate 100, and includes a source region 601 and a drain region 603 located on opposite sides of the channel region 602 in the extension direction of the active part 600. One of the source region 601 and the drain region 603 is located on a side of the channel region 602 facing the BL 400, and is connected to the BL 400.

It should be noted that the active part 600 extends in the direction perpendicular to the substrate 100, thereby forming a Vertical gate all-around field effect transistor (VGAA). In this way, the space occupied by the transistor structure in the semiconductor structure may be effectively reduced. Furthermore, the WL 200 surrounds an outer periphery of the channel region 602 of an active region. Therefore, the gate control ability of the transistor structure may be effectively improved. The gate dielectric layer 700 is made of materials with high dielectric constants, and thus a gate leakage current may be effectively reduced, thereby improving performance of the transistor structure and ensuring storage performance of the DRAM.

The source region 601 and the drain region 603 of the active part 600 are located on opposite sides of the channel region 602 in the extension direction of the active part 600 respectively, and one of the source region 601 and the drain region 603 is connected to the BL 400. With reference to FIG. 4, the embodiment of the disclosure is described by an example where the drain region 603 is located on a side of the channel region 602 facing the substrate 100 and the source region 601 is located on a side of the channel region 602 away from the substrate 100. Based on a fact that the drain region 603 is close to the substrate 100, therefore the drain region 603 may be connected to the BL 400.

The semiconductor structure of the embodiment of the disclosure may further include a capacitor structure (not shown) which may be located on a side of the transistor structure away from the substrate 100 and thus may be connected to the source region 601. A working operation of the DRAM includes operations of storing electrical signals and of reading electrical signals. Storing electrical signals is taken as an example, a control signal is written into the WL 200, an electrical signal to be stored is written into the BL 400. The BL 400 transmits the electrical signal to be stored to the drain region 603 of the transistor structure, the control signal in the WL 200 acts on the channel region 602 of the transistor structure and controls the channel region 602 to be turned on. In the drain region 603, the electrical signal to be stored is transmitted to the source region 601 via the channel region 602. Then the electrical signal to be stored is written into the capacitor structure via the source region 601 to complete the storage. The operation of reading electrical signals is the inverse of the above operation, and detailed description thereof will be omitted. On the above basis, the disclosure provides the WL isolation structure 300 between adjacent WLs 200, and provides the BL isolation structure 500 between adjacent BLs 400, thereby ensuring stable transmission of electrical signals in the WLs 200 and BLs 400, and ensuring stable storage and reading operations of the DRAM.

The above capacitor structure may include a first electrode layer, a capacitance dielectric layer and a second electrode layer arranged in stack. One of the first electrode layer and the second electrode layer is connected to the source region 601 of the transistor structure. The disclosure does not make limitations to specific structures of the capacitor structure.

Specifically, multiple semiconductor columns **100*b* are provided on the substrate 100. The semiconductor columns are arranged in an array and extend in a direction away from the substrate 100. The BL 400 is located in the semiconductor column 100***b* on a side of the semiconductor column 100*b* facing the substrate 100. The active part 100 is located in the semiconductor column 100*b*, and the WL 200 is arranged around at least a part of an outer periphery of a channel region 602 of the semiconductor column 100*b*.

It should be noted that the semiconductor column 100*b* may be made of the same material as the substrate 100. In this way, the difficulty of manufacturing the semiconductor column 100*b* may be reduced, and the stability at an interface between the semiconductor column 100*b* and the substrate 100 may be improved. The semiconductor column 100*b* may be formed by etching the substrate 100 or by epitaxial growth on the substrate 100, but the present disclosure is not limited thereto.

The semiconductor columns 100*b* are arranged in an array, and the active part 600 of each transistor structure is located in a respective semiconductor column 100*b*. which may reduce difficulty of manufacturing the transistor structure. Furthermore, the BL 400 is located on a side of the semiconductor column 100*b* facing the substrate 100, and the WL 200 is arranged around at least a part of an outer periphery of the semiconductor column 100*b*. In this way, the semiconductor column 100*b* may be used as a support structure for the WL 200 and the BL 400, thereby improving structural stability of the WL 200 and the BL 400. Similarly, the semiconductor column 100*b* may also be the support structure for the capacitor structure formed subsequently, thereby improving overall structural stability of the DRAM.

Figure 5:
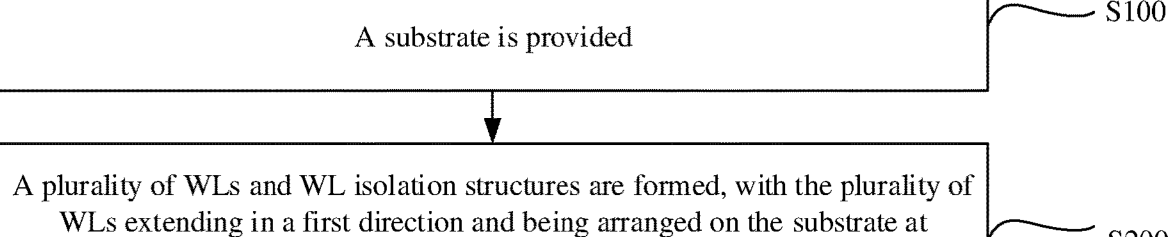
FIG. 5 is a schematic flowchart of a method for manufacturing a semiconductor structure according to an embodiment of the disclosure.

According to a second aspect, the disclosure provides a method for manufacturing a semiconductor structure. FIG. 5 is a schematic flowchart of a method for manufacturing a semiconductor structure according to an embodiment of the disclosure. With reference to FIG. 5, the manufacturing method includes the following operations S100 and S200.

Figure 6:
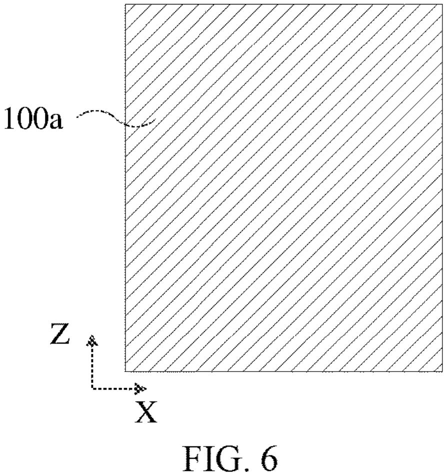
FIG. 6 is a schematic view of providing a semiconductor layer according to an embodiment of the disclosure.

At S100, a substrate is provided. FIG. 6 is a schematic view of providing a semiconductor layer according to an embodiment of the disclosure. With reference to FIG. 6, the operation of providing the substrate 100 includes an operation of providing a semiconductor layer 100*a*.

It should be noted that the semiconductor layer 100*a* may be formed by Atomic Layer Deposition (ALD), Physical Vapor Deposition (PVD) or Chemical Vapor Deposition (CVD). Materials of the semiconductor layer 100*a* may include, but are not limited to monocrystalline silicon, polycrystalline silicon, amorphous silicon, silicon germanium compounds, or SOI. A thickness direction of the substrate 100 may be a direction indicated by Z in the figures.

After the substrate 100 is formed, the method also includes an operation of forming multiple WL grooves 101 and multiple BL grooves 102. The WL grooves 101 and the BL grooves 102 are located in the semiconductor layer 100*a*, a portion of the semiconductor layer 100*a* located between the WL groove 101 and the BL groove 102 forms semiconductor columns 100*b*, and a portion of the semiconductor layer 100*a* located at bottom of each semiconductor column 100*b* forms the substrate 100. The WL grooves 101 extend in the first direction and are arranged at intervals in the second direction, and multiple BL grooves 102 extend in the second direction and are arranged at intervals in the first direction.

Figures 7, 8:
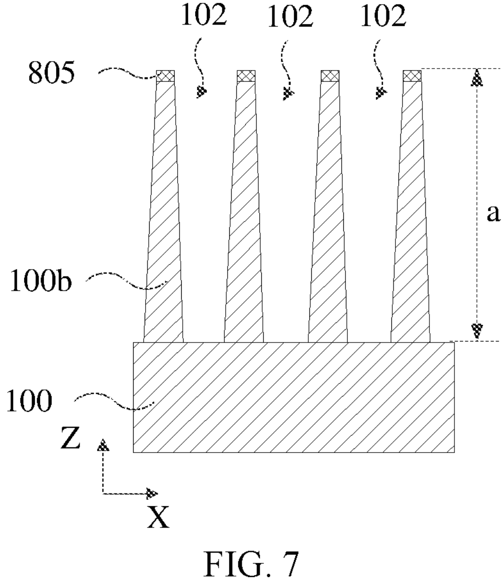
FIG. 7 is a schematic view of forming a bit line (BL) groove according to an embodiment of the disclosure.
FIG. 8 is a schematic view of forming a first dielectric layer according to an embodiment of the disclosure.
Figure 9:
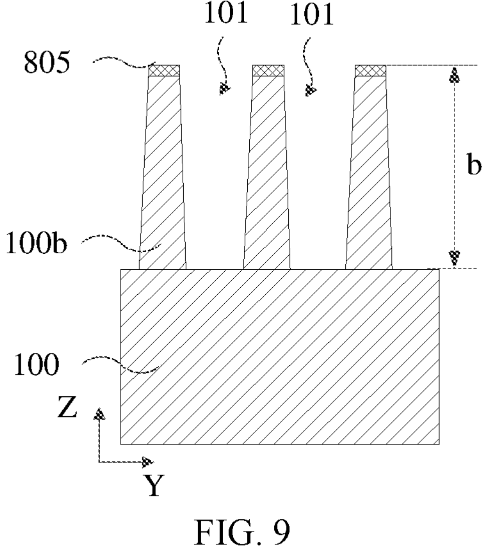
FIG. 9 is a schematic view of forming a word line (WL) groove according to an embodiment of the disclosure.

FIG. 7 is a schematic view of forming a BL groove according to an embodiment of the disclosure, FIG. 8 is a schematic view of forming a first dielectric layer according to an embodiment of the disclosure, and FIG. 9 is a schematic view of forming a WL groove according to an embodiment of the disclosure. With reference to FIG. 7 and FIG. 9, the operation of forming multiple WL grooves 101 and multiple BL grooves 102 includes an operation in which the semiconductor layer 100*a* is etched to form multiple BL grooves 102 in the semiconductor layer 100*a*.

A mask layer 805 with a first mask pattern is formed on the semiconductor layer 100*a*, and the first mask pattern is provided with multiple mask openings extending in the second direction and arranged at intervals in the first direction. A part of the semiconductor layer 100*a* is etched and removed along the first mask pattern of the mask layer 805, thereby forming multiple BL grooves 102 extending in the second direction and arranged at intervals in the first direction.

After multiple BL grooves 102 are formed, the method also includes an operation of forming a first dielectric layer 800 filled in the BL grooves 102. A structure of the first dielectric layer 800 is shown in FIG. 8. The first dielectric layer 800 is filled into the BL grooves 102, and may achieve a protection effect for the BL grooves 102 without affecting structures of the BL grooves 102 during the formation of the WL groove 101. A top surface of the first dielectric layer 800 is flush with a top surface of the mask layer 805.

After the first dielectric layer 800 is formed, the method also includes an operation in which the semiconductor layer 100*a* and the first dielectric layer 800 are etched to form multiple WL grooves 101. A mask layer 805 with a second mask pattern is formed on the semiconductor layer 100*a* and the first dielectric layer 800, and the second mask pattern is provided with multiple mask openings extending in the first direction and arranged at intervals in the second direction. A part of the semiconductor layer 100*a* and a part of the first dielectric layer 800 are etched and removed along the second mask pattern of the mask layer 805, thereby forming multiple WL grooves 101 extending in the first direction and arranged at intervals in the second direction. The material of the first dielectric layer 800 may include, but are not limited to silicon oxide, silicon nitride, silicon carbide, or silicon carbonnitride.

With reference to FIG. 7 and FIG. 9, a depth of the WL grooves 101 is smaller than a depth of the BL grooves 102. The depth of the BL grooves 102 may be indicated by "a" in FIG. 7, and the depth of the WL grooves 101 may be indicated by "b" in FIG. 9. The depth b is smaller than the depth a, thus a large part of the semiconductor layer 100*a* may be exposed through the BL groove 102, which facilitates doping treatment of the exposed semiconductor layer 100*a* through the WL grooves 101 to form the BLs 400. A specific doping process will be described in detail further below.

After multiple WL grooves 101 and multiple BL grooves 102 are formed, the method also includes S200. At S200, multiple WLs and WL isolation structures are formed. The multiple WLs extend in a first direction and are arranged on the substrate at intervals in a second direction. Each WL isolation structure is located between every two adjacent WLs, and at least partially includes a first isolation layer and a second isolation layer stacked in the second direction and made of different materials. The first direction and the second direction intersect with each other.

It should be noted that in the disclosure, the WL isolation structure 300 is formed by providing the first isolation layer 301 and the second isolation layer 302 made of different materials and stacked in the second direction, which may increase a transmission path of interfering electrons in adjacent WLs 200 and alleviate an interference effect of the interfering electrons on adjacent WLs 200. Therefore, the isolation effect of the WL isolation structure 300 on adjacent WLs 200 can be ensured.

The WL isolation structure 300 of the embodiment of the disclosure includes the first isolation layer 301, the second isolation layer 302 and a third isolation layer 303 sequentially stacked in the second direction. The material of the first isolation layer 301 is the same as that of the third isolation layer 303. The material of one of the first isolation layer 301 and the second isolation layer 302 includes a nitride, and the material of the other of the first isolation layer 301 and the second isolation layer 302 includes an oxide. The functions of the first isolation layer 301, the second isolation layer 302 and the third isolation layer 303, as well as materials of the three layers have been explained in the above embodiments and will not be elaborated herein.

In some embodiments, in a cross section of the WL isolation structure 300 in the second direction, the first isolation layer 301 and the third isolation layer 303 are unconnected with each other. In this way, structural flexibility of the WL isolation structure 300 may be improved, while the isolation effect of the WL isolation structure 300 is ensured.

In some other embodiments, in a cross section of the WL isolation structure 300 in the second direction, the first isolation layer 301 and the third isolation layer 303 are connected to each other and form a U-shape structure. A joint of the first isolation layer 301 and the third isolation layer 303 is located on a side of the second isolation layer 302 facing the substrate 100. In the disclosure, a process of manufacturing the WL isolation structure 300 is explained in detail by an example where the first isolation layer 301 and the third isolation layer 303 are connected to each other.

Specifically, the operation of forming multiple WLs 200 and the WL isolation structures 300 includes an operation of forming the WL isolation structures 300 in the WL grooves 101, with the WL isolation structures extending in the first direction and being arranged at intervals in the second direction.

The operation of forming the WL isolation structures 300 includes an operation of forming a second dielectric layer 801 located on sidewalls of the WL groove 101, with first grooves 801*a* being formed in the second direction between two sidewalls of the WL groove 101 on which the second dielectric layer 801 is located.

Figure 10:
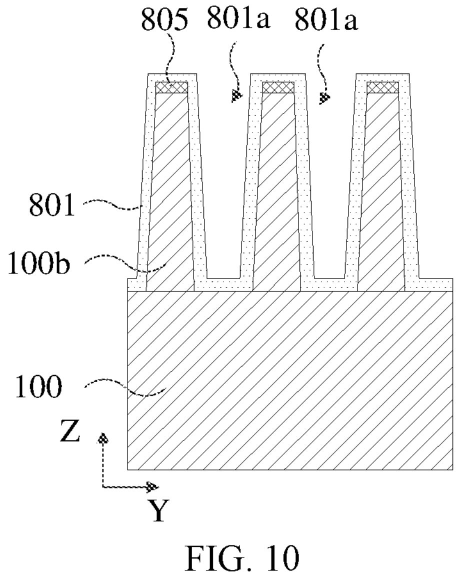
FIG. 10 is a schematic view of forming a second dielectric layer according to an embodiment of the disclosure.

FIG. 10 is a schematic view of forming a second dielectric layer according to an embodiment of the disclosure. With reference to FIG. 10, the second dielectric layer 801 may be formed by deposition, and covers a sidewall of each semiconductor column 100*b* located in each WL groove 101, and covers a top surface of each semiconductor column 100*b* (including the mask layer 805 retained on the top surface of the semiconductor column 100*b*). Based on a fact that the second dielectric layer 801 has a small thickness and does not fully fill the WL groove 101, the first grooves 801*a* may be formed in the second dielectric layer 801 in the second direction.

For example, materials of the second dielectric layer 801 may include, but are not limited to silicon oxide, silicon nitride, silicon carbide, or silicon carbonnitride. Materials of the first dielectric layer 800 may be the same as that of the second dielectric layer 801 to reduce the difficulty of manufacturing the DRAM.

Figure 11:
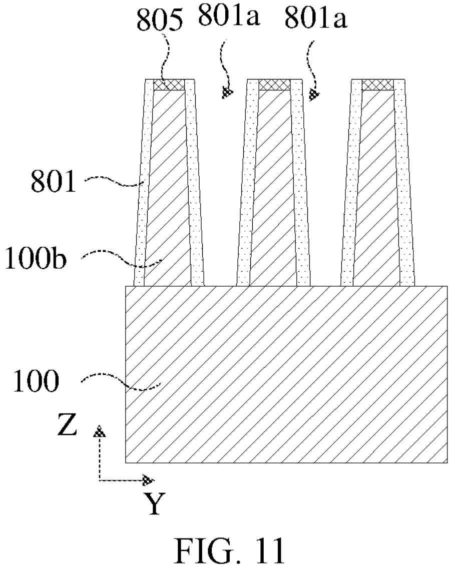
FIG. 11 is a schematic view of etching a second dielectric layer according to an embodiment of the disclosure.

After the second dielectric layer 801 is formed, the method also includes an operation of etching and removing a portion of the second dielectric layer 801 located on a top surface of the substrate 100 and the top surface of each semiconductor column 100*b*, to expose the top surface of the substrate 100 located in the WL groove 101. FIG. 11 is a schematic view of etching a second dielectric layer according to an embodiment of the disclosure, and the above structure may refer to that shown in FIG. 11.

After the second dielectric layer 801 is formed and before the WL isolation structure 300 is formed, the method also includes an operation of performing a doping process to the semiconductor layer 100*a* along the first grooves 801*a* to form multiple BLs 400 in the substrate 100, with the BLs 400 extending in the second direction and being arranged at intervals in the first direction. The first dielectric layer 800 located between two adjacent BLs 400 forms a BL isolation structure 500.

Figure 12:
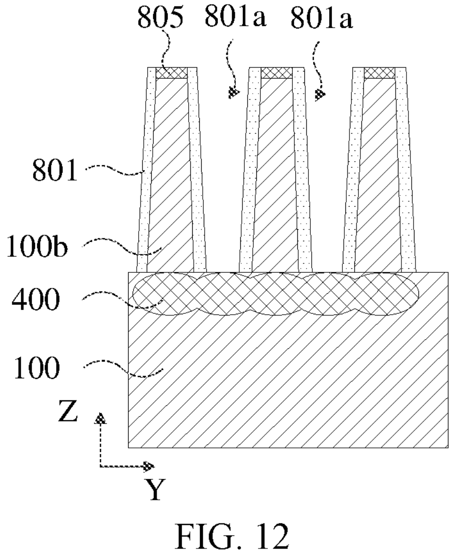
FIG. 12 is a schematic view of forming a BL according to an embodiment of the disclosure.
Figures 17, 18:
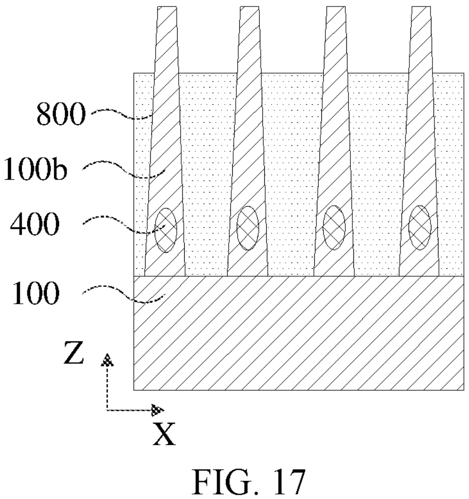
FIG. 17 is a schematic view of performing an etching back process on a first dielectric layer to expose a part of a semiconductor column according to an embodiment of the disclosure.
FIG. 18 is a schematic view of forming a support layer, viewed in a second direction, according to an embodiment of the disclosure.

FIG. 12 is a schematic view of forming a BL according to an embodiment of the disclosure, and FIG. 17 is a schematic view of performing an etching back process on a first dielectric layer and exposing a part of each semiconductor column according to an embodiment of the disclosure. With reference to FIG. 12, based on a fact that the depth of the WL groove 101 is smaller than the depth of the BL groove 102, a larger part of the semiconductor layer 100*a* is exposed through the WL grooves 101 than through the BL grooves 102, and the extra exposed part of the semiconductor layer 100*a* is doped along the first grooves 801*a* in the WL groove 101 to form the BLs 400.

Only the portion of the semiconductor layer 100*a* corresponding to each first groove 801*a* may be doped along the first groove 801*a*, to render it conductive. The portions of the semiconductor layers 100*a* corresponding to two adjacent first grooves 801*a* are doped and become conductive, and then are abutted against each other and electrically communicated with each other. In this way, conductive strip structures, which extend in the second direction and are arranged at intervals in the first direction, are formed. The conductive strip structures are the BLs 400.

The doping may be ion implantation, and ions selected for the ion implantation may include, but are not limited to cobalt (Co) or a nickel platinum alloy (NiPt). Co or NiPt reacts with silicon (Si) of the semiconductor layer 100*a* to form cobalt silicide (CoSi) or nickel platinum silicide (NiPtSi). After an annealing treatment, CoSi or NiPtSi diffuses to the rest of the semiconductor layer 100*a*, to form the above conductive strip structure.

Figure 13:
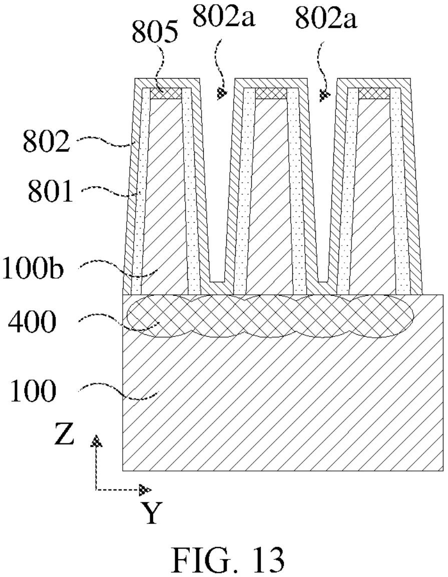
FIG. 13 is a schematic view of forming a third dielectric layer according to an embodiment of the disclosure.

After the BLs 400 is formed, the method also includes an operation of forming a third dielectric layer 802 located in the first grooves 801*a*, with second grooves 802*a* being formed in the third dielectric layer 802 in the second direction. FIG. 13 is a schematic view of forming a third dielectric layer according to an embodiment of the disclosure. With reference to FIG. 13, the third dielectric layer 802 may be formed by deposition, and may cover the second dielectric layer 801 and the top surface of each semiconductor column 100*b* (including the mask layer 805 retained on the top surface of each semiconductor column 100*b*). Based on a fact that the third dielectric layer 802 has a small thickness and does not fully fill the first grooves 801*a*, the second grooves 802*a* are formed in the third dielectric layer 802 in the second direction.

For example, materials of the third dielectric layer 802 may include, but are not limited to silicon oxide, silicon nitride, silicon carbide, or silicon carbonnitride. The Material of the third dielectric layer 802 may be different from that of the second dielectric layer 801.

Figure 14:
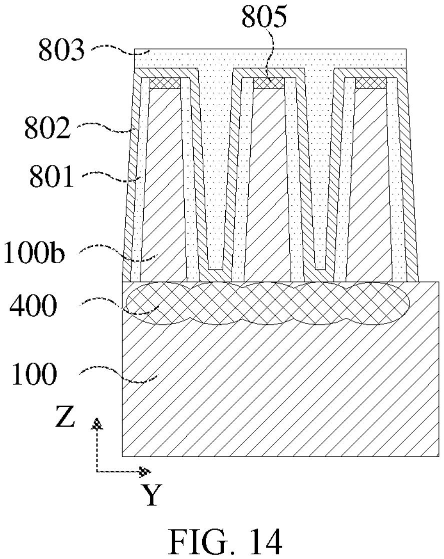
FIG. 14 is a schematic view of forming a fourth dielectric layer according to an embodiment of the disclosure.

After the third dielectric layer 802 is formed, the method also includes an operation of forming a fourth dielectric layer 803 filled in the second grooves 802*a*. FIG. 14 is a schematic view of forming a fourth dielectric layer according to an embodiment of the disclosure. With reference to FIG. 14, the fourth dielectric layer 803 may be formed by deposition, and has a large thickness to ensure that the second grooves 802*a* are fully filled with the fourth dielectric layer and a top surface of the third dielectric layer 802 is covered by the fourth dielectric layer.

For example, the material of the fourth dielectric layer 803 include, but are not limited to silicon oxide, silicon nitride, silicon carbide, or silicon carbonnitride, and is different from the material of the third dielectric layer 802. Of course, the material of the fourth dielectric layer 803 may be the same as that of the second dielectric layer 801.

The WL isolation structure 300 is formed by the third dielectric layer 802 and the fourth dielectric layer 803. The first isolation layer 301 and the third isolation layer 303 are formed by the third dielectric layer 802, and structure of the third dielectric layer 802 is the U-shape structure in the WL isolation structure 300 which is formed by the first isolation layer 301 and the third isolation layer 303 connected to each other. The second isolation layer 302 is formed by the fourth dielectric layer 803.

After the WL isolation structures 300 is formed, the method also includes an operation of forming multiple WLs 200 each located between every two adjacent WL isolation structures 300. That is, for every two adjacent WL isolation structures, a respective WL is located therebetween. Specifically, the operation of forming multiple WLs 200 includes the following operation.

Figure 15:
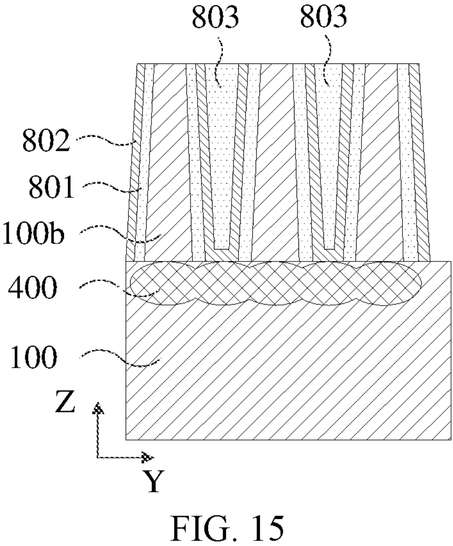
FIG. 15 is a schematic view of performing an etching back process on a fourth dielectric layer, a third dielectric layer, a second dielectric layer and a mask layer according to an embodiment of the disclosure.

An etching back process is performed to each of the first dielectric layer 800, the second dielectric layer 801, the third dielectric layer 802, the fourth dielectric layer 803 and the mask layer 805 to remove a part of the thickness thereof, to expose the top surface of each semiconductor column 100*b*. FIG. 15 is a schematic view of performing the etching back process to a fourth dielectric layer, a third dielectric layer, a second dielectric layer and a mask layer according to an embodiment of the disclosure. Only a structure formed by the etching back process performed to the second dielectric layer 801, the third dielectric layer 802, the fourth dielectric layer 803 and the mask layer 805 is shown in FIG. 15, and the etching back process may be completed by a Chemical Mechanical Polishing (CMP) process.

No specific etching direction is specified for the etching back process, and thus the first dielectric layer 800 of a part of the thickness in the BL groove 102 may also be etched and removed in the first direction.

Figure 16:
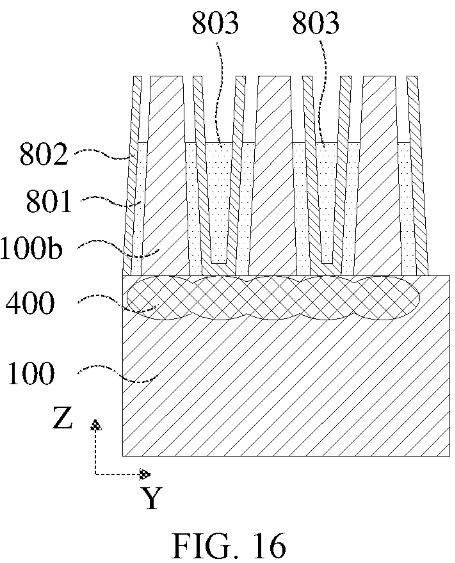
FIG. 16 is a schematic view of performing an etching back process on a fourth dielectric layer and a second dielectric layer according to an embodiment of the disclosure.

The etching back process is performed to each of the first dielectric layer 800, the second dielectric layer 801 and the fourth dielectric layer 803 to remove a part of the thickness thereof, and then a part of the semiconductor column 100*b* and a part of the third dielectric layer 802 are exposed. FIG. 16 is a schematic view of performing the etching back process to a fourth dielectric layer and a second dielectric layer according to an embodiment of the disclosure. Only a structure formed by the etching back process of the fourth dielectric layer 803 and the second dielectric layer 801 is shown in FIG. 16, and the etching back process may be completed by chemical etching, for example, by selecting an etching solution with a large selective etching ratio for the fourth dielectric layer 803 and the third dielectric layer 802.

In the embodiment of the disclosure, each of the first dielectric layer 800, the second dielectric layer 801 and the fourth dielectric layer 803 may be silicon oxide. The third dielectric layer 802 may be silicon nitride. On the above basis, the first dielectric layer 800 of a part of the thickness in the BL groove 102 may also be etched and removed in the first direction. The structure thereof may refer to that shown in FIG. 17.

After the etching back process, the method also includes an operation of forming support layers 804. The support layer located in the WL groove 101 is abutted against the exposed semiconductor column 100*b* and third dielectric layer 802. Sidewalls of the BL groove 102 is covered by the support layer 804 located in the BL groove 102. The third grooves 804*a* are formed in the first direction between the support layers 804 located on two sidewalls of the BL groove 102.

Figures 19, 20:
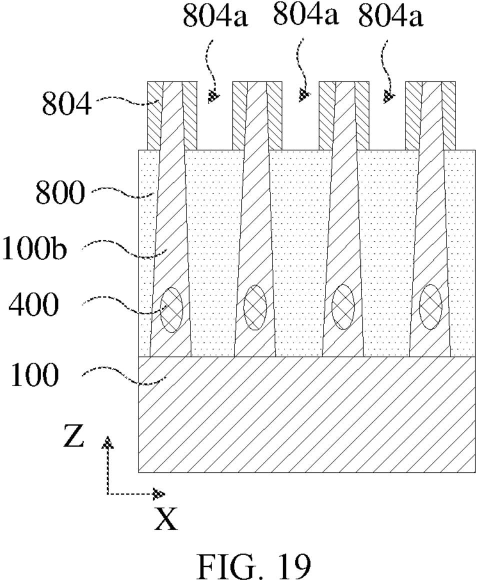
FIG. 19 is a schematic view of forming a support layer, viewed in a first direction, according to an embodiment of the disclosure.
FIG. 20 is a schematic view of forming a gate dielectric layer, viewed in a second direction, according to an embodiment of the disclosure.

FIG. 18 is a schematic view of forming a support layer, viewed in a second direction, according to an embodiment of the disclosure, and FIG. 19 is a schematic view of forming a support layer, viewed in a first direction, according to an embodiment of the disclosure. With reference to FIG. 18 and FIG. 19, the support layer 804 may play a role of supporting the semiconductor column 100*b*, while exposing a part of the first dielectric layer 800 at the bottom, to avoid tilting or collapsing of the semiconductor column 100*b* in subsequent manufacturing processes, and facilitate the forming of the WL 200 subsequently.

The support layer 804 located in the WL groove 101 is abutted against the exposed semiconductor column 100*b* and third dielectric layer 802, and the support layer 804 located in the BL groove 102 covers the sidewalls of the BL groove 102. This structure may be achieved through following two ways.

As for the first way, a width of the BL groove 102 may be greater than a width of the WL groove 101. In this way, for the support layer 804 of the same thickness, the support layer 804 may fully fill the WL groove 101, but not fully fill the BL groove 102, and cover only the sidewalls of the BL groove 102.

As for the second way, the width of the WL groove 101 is substantially equal to the width of the BL groove 102, and the support layer 804 may fully fill both of the WL groove 101 and the BL groove 102. Then, a part of the support layer 804 located in the BL groove 102 is removed by mask etching, and the retained support layer 804 covers the sidewalls of the BL groove 102.

Both of the above two ways may ensure that the third groove 804*a* may be formed in the support layer 804 of the BL groove 102 in the first direction, to facilitate the forming of the WL 200 through the third groove 804*a*.

Specifically, the etching back process is performed to each of the first dielectric layer 800 and the second dielectric layer 801, to etch and remove a part of the thickness thereof along the third groove 804*a*, and then a part of the semiconductor column 100*b* is exposed. The etching process may be completed by a chemical etching process, for example, by selecting an etching solution with a large selective etching ratio for the first dielectric layer 800 and the third dielectric layer 802. In this process, the third dielectric layer 802 is arranged on both sides of the fourth dielectric layer 803, and is not in contact with the etching solution. Therefore, the process of etching the first dielectric layer 800 and the second dielectric layer 801 does not affect the fourth dielectric layer 803 in the WL isolation structure 300.

It should be noted that an etching depth of this operation should not be too large to avoid a problem of electrical interference due to a small distance between the WL 200 and the BL 400 formed subsequently.

Figure 21:
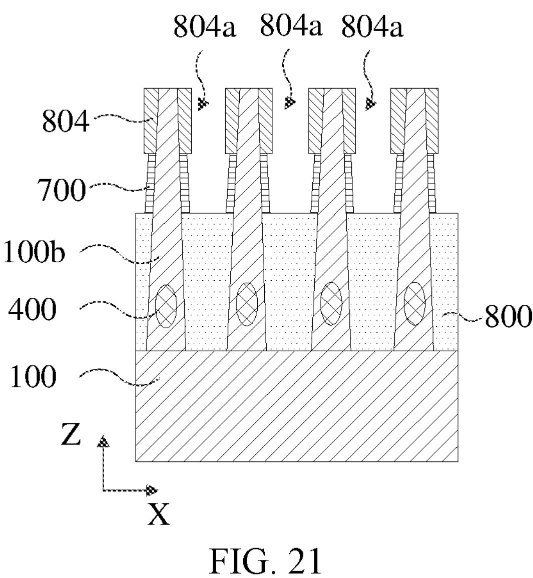
FIG. 21 is a schematic view of forming a gate dielectric layer, viewed in a first direction, according to an embodiment of the disclosure.

A gate dielectric layer 700 is formed and covers at least a part of a circumferential sidewall of the exposed part of each semiconductor column 100*b*. FIG. 20 is a schematic view of forming a gate dielectric layer, viewed in a second direction, according to an embodiment of the disclosure, and FIG. 21 is a schematic view of forming a gate dielectric layer, viewed in a first direction, according to an embodiment of the disclosure. With reference to FIG. 20 and FIG. 21, the gate dielectric layer 700 may be formed by deposition, and materials thereof have been explained in the above embodiments and are not elaborated here.

After the gate dielectric layers 700 are formed, the method also includes an operation of forming the WLs 200, each of which is located between adjacent WL isolation structures 300, and abutted against the gate dielectric layer 700. The WLs 200 may be formed by deposition, and materials of the WL 200 include, but are not limited to tungsten (W) and polycrystalline silicon.

With reference to FIG. 2 and FIG. 4, a channel region 602 of an active part 600 of a transistor structure is formed by the semiconductor column 100*b* corresponding to the WL 200. The WL 200 is electrically isolated from the channel region 602 by the gate dielectric layer 700. The semiconductor column 100*b* located on a side of the channel region 602 facing the substrate 100 forms one of the source region 601 and the drain region 603 of the active part 600 of the transistor structure, and is connected to the BL 400. In the embodiment of the disclosure, the drain region 603 of the transistor is located on the side facing the substrate 100, and is connected to the BL 400.

After the WLs 200 are formed, the method also includes an operation of forming a transistor structure which may include a first electrode layer, a capacitance dielectric layer and a second electrode layer arranged in stack. The disclosure does not make limitations to the process of forming the transistor structure. One of the first electrode layer and the second electrode layer of the transistor structure is connected to the source region 601.

In the descriptions of the embodiments of the disclosure, it should be understood that unless otherwise specified and limited clearly, terms "install", "connected" and "connect" should be understood in a broad sense. For example, they may indicate fixed connection, or indirect connection through intermediate media, or communication inside two components, or an interaction relationship between two components. Specific meanings of the above terms in the disclosure may be understood by those of ordinary skill in the art according to specific cases. Terms "up", "down", "front", "rear", "vertical", "horizontal", "top", "bottom", "inside", "outside", or the like indicate orientation or position relationships based on orientation or position relationships shown in the drawings, and are only intended to facilitate describing the disclosure and simplify the descriptions, rather than indicating or implying that the referred device or component must have a specific orientation, or must be configured and operated in a specific orientation, and thus cannot be understood as limitations on the disclosure. In the descriptions of the disclosure, "multiple" means two or more, unless otherwise specified precisely and specifically.

Terms "first", "second", "third", "fourth", or the like (if any) in the description and claims of the disclosure as well as the above drawings, are intended to distinguish similar objects and are not intended to describe a specific order or sequence. It should be understood that the terms used in this way may be interchanged in appropriate cases, so that the embodiments of the disclosure described here may be implemented for example in an order other than those illustrated or described here. Furthermore, terms "including" and "having" as well as any variations thereof, are intended to cover non-exclusive inclusion. For example, a process, method, system, product or device including a series of operations or units are not limited to those operations or units listed clearly, instead, may include other operations or units which are not clearly listed or inherent to these processes, methods, products or devices.

Finally, it should be noted that the above embodiments are only intended to explain the technical solutions of the disclosure, rather than limiting the technical solutions of the disclosure; although the disclosure is explained in detail with reference to the forgoing embodiments, it should be understood by those of ordinary skill in the art that they may still modify the technical solutions recorded in the forgoing embodiments, or equivalently replace part or all of the technical features in the technical solutions; and these modifications or replacements do not make essence of the corresponding technical solutions depart from the scope of the technical solutions of the embodiments of the disclosure.

What is claimed is:

1. A semiconductor structure, comprising a substrate;

a plurality of Word Lines (WLs), the plurality of WLs extend in a first direction, and are arranged on the substrate at intervals in a second direction;

for every two adjacent WLs, a WL isolation structure is arranged there between, the WL isolation structure comprising at least a first isolation layer and a second isolation layer stacked in the second direction and made of different materials, and the first direction and the second direction intersecting with each other; and a plurality of Bit Lines (BLs) arranged on the substrate and located on a side of the WLs facing the substrate, the plurality of BLs extend along the second direction, and are arranged at intervals in the first direction, for every two adjacent BLs, a BL isolation structure is arranged there between.

2. The semiconductor structure of claim 1, wherein the WL isolation structure comprises the first isolation layer, the second isolation layer and a third isolation layer sequentially stacked in the second direction, and the first isolation layer being made of the same material as the third isolation layer.

3. The semiconductor structure of claim 2, wherein in a cross section of the WL isolation structure in the second direction, the first isolation layer and the third isolation layer are connected to each other and form a U-shape structure, a joint of the first isolation layer and the third isolation layer being located on a side of the second isolation layer facing the substrate.

4. The semiconductor structure of claim 1, wherein a material of one of the first isolation layer and the second isolation layer comprises a nitride, and a material of the other of the first isolation layer and the second isolation layer comprises an oxide.

5. The semiconductor structure of claim 1, further comprising transistor structures, each of which is arranged on the substrate and comprises an active part, a respective one of the WLs being arranged around at least a part of an outer periphery of the active part and corresponding to a channel region of the active part, and a gate dielectric layer being arranged between the respective one of the WLs and the channel region.

6. The semiconductor structure of claim 5, wherein the active part extends in a direction perpendicular to the substrate, and comprises a source region and a drain region located on opposite sides of the channel region in an extension direction of the active part respectively, one of the source region and the drain region is located on a side of the channel region facing the BLs, and connected to the respective one of the BLs.

7. The semiconductor structure of claim 6, wherein the substrate is provided with a plurality of semiconductor columns arranged in an array and extending in a direction away from the substrate, each of the BLs being located in a respective one of the semiconductor columns on a side of the semiconductor column facing the substrate, the active part is located in the semiconductor column, and the respective one of the WLs is arranged around at least a part of an outer periphery of a channel region of the semiconductor column.

8. A method for manufacturing a semiconductor structure, comprising:

providing a substrate; and forming a plurality of Word Lines (WLs) and WL isolation structures, with the plurality of WLs extending in a first direction and being arranged on the substrate at intervals in a second direction, wherein for every two adjacent WLs, a respective one of the WL isolation structures is arranged there between, each of the WL isolation structures at least partially comprising a first isolation layer and a second isolation layer stacked in the second direction and made of different materials, first direction and the second direction intersecting with each other;

wherein the WL isolation structure comprises the first isolation layer, the second isolation layer and a third isolation layer sequentially stacked in the second direction, and the first isolation layer being made of the same material as the third isolation layer;

wherein in a cross section of the WL isolation structure in the second direction, the first isolation layer and the third isolation layer are connected to each other and form a U-shape structure, and a joint of the first isolation layer and the third isolation layer being located on a side of the second isolation layer facing the substrate; and wherein the providing the substrate comprises:

providing a semiconductor layer;

forming a plurality of WL grooves and a plurality of Bit Line (BL) grooves located in the semiconductor layer, with a portion of the semiconductor layer located between the WL grooves and the BL grooves forming semiconductor columns, and a portion of the semiconductor layer located at bottom of the semiconductor columns forming the substrate;

wherein the plurality of WL grooves extend in the first direction and are arranged the at intervals in the second direction, and the plurality of BL grooves extend in the second direction and are arranged at intervals in the first direction.

9. The method for manufacturing a semiconductor structure of claim 8, wherein a material of one of the first isolation layer and the second isolation layer comprises a nitride, and a material of the other of the first isolation layer and the second isolation layer comprises an oxide.

10. The method for manufacturing a semiconductor structure of claim 8, wherein the forming the plurality of WL grooves and the plurality of BL grooves comprises:

etching the semiconductor layer to form the plurality of BL grooves in the semiconductor layer;

forming a first dielectric layer which is filled in the BL grooves; and etching the semiconductor layer and the first dielectric layer to form the plurality of WL grooves.

11. The method for manufacturing a semiconductor structure of claim 10, wherein the forming the plurality of WLs and the WL isolation structures comprises:

forming the WL isolation structures in the WL grooves, with the WL isolation structures extending in the first direction and the WL isolation structures being arranged at intervals in the second direction; and forming the plurality of WLs, wherein for every two adjacent WL isolation structures, a respective one of the WLs is arranged there between.

12. The method for manufacturing a semiconductor structure of claim 11, wherein the forming the WL isolation structures comprises:

forming a second dielectric layer located on sidewalls of each WL groove, with each of first grooves being formed in the second direction between two sidewalls of the respective WL groove on which the second dielectric layer located;

forming a third dielectric layer located in the first grooves, with second grooves being formed in the third dielectric layer in the second direction;

forming a fourth dielectric layer which is filled in the second grooves; and the WL isolation structures are formed by the third dielectric layer and the fourth dielectric layer, the first isolation layer and the third isolation layer are formed by the third dielectric layer, and the second isolation layer is formed by the fourth dielectric layer.

13. The method for manufacturing a semiconductor structure of claim 12, wherein forming the plurality of WLs comprises:

performing an etching back process to each of the first dielectric layer, the second dielectric layer and the fourth dielectric layer to remove a part of the thickness thereof, to expose a part of the semiconductor column and a part of the third dielectric layer;

forming support layers, with the support layers located in the WL grooves being abutted against exposed parts of the semiconductor columns and the third dielectric layer, the support layers located in the BL grooves covering sidewalls of the BL grooves, and third grooves being formed in the first direction between the support layers located on two sidewalls of each BL groove;

etching and removing each of the first dielectric layer and the second dielectric layer along the third groove to remove a part of the thickness thereof, to expose a part of the semiconductor column;

forming a gate dielectric layer covering at least a part of a circumferential sidewall of the exposed part of each semiconductor column; and forming the WLs, each of which is located between adjacent WL isolation structures and abutted against the gate dielectric layer;

wherein a channel region of an active part of each of transistor structures is formed by a portion of the respective semiconductor column corresponding to the respective WL.

14. The method for manufacturing a semiconductor structure of claim 13, further comprising, after the substrate is formed and before the WL isolation structures are formed:

doping the semiconductor layer along the first grooves, to form a plurality of BLs in the substrate, wherein the plurality of BLs extend in the second direction and are arranged at intervals in the first direction; and the first dielectric layer located between two adjacent BLs forms a BL isolation structure, wherein one of source and drain regions of the active part of the transistor structure is formed by a portion of the respective semiconductor column located on a side of the channel region facing the substrate, and is connected to the respective BL.

* * * * *